(12) United States Patent
Okuda et al.

(10) Patent No.: US 7,305,743 B2
(45) Date of Patent: Dec. 11, 2007

(54) METHOD OF PRODUCING PIEZOELECTRIC CERAMIC DEVICE

(75) Inventors: Kazuhiro Okuda, Katano (JP); Yasushi Goto, Ikeda (JP); Seiichi Minami, Sapporo (JP); Hiroki Moriwaki, Sanda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 527 days.

(21) Appl. No.: 10/992,779

(22) Filed: Nov. 22, 2004

(65) Prior Publication Data

US 2005/0115039 A1  Jun. 2, 2005

(30) Foreign Application Priority Data

Nov. 28, 2003  (JP) .............................. 2003-399060

(51) Int. Cl.
*H01L 41/22* (2006.01)
*H01L 41/00* (2006.01)

(52) U.S. Cl. .................. 29/25.35; 29/830; 29/831; 29/832; 310/311

(58) Field of Classification Search ............... 29/25.35, 29/831, 832, 830; 310/358, 311, 334, 327; 204/192.34; 264/430, 614; 219/121.69, 219/121.71

See application file for complete search history.

(56) References Cited

U.S. PATENT DOCUMENTS 3,531,182 A * 9/1970 Schueler et al. ............ 359/252
3,744,875 A * 7/1973 Haertling et al. ........... 359/251
5,359,760 A * 11/1994 Busse et al. ................ 29/25.35
5,825,121 A * 10/1998 Shimada ..................... 310/358
6,140,746 A * 10/2000 Miyashita et al. .......... 310/358

FOREIGN PATENT DOCUMENTS

| JP | 9-169566 | 6/1997 |
|---|---|---|
| JP | 10-007458 | 1/1998 |

* cited by examiner

*Primary Examiner*—A. Dexter Tugbang
*Assistant Examiner*—Tai Van Nguyen
(74) *Attorney, Agent, or Firm*—Wenderoth, Lind & Ponack, L.L.P.

(57) ABSTRACT

A piezoelectric ceramic compound expressed by a basic formula of $Pb(Zn_{1/3}Nb_{2/3})_a Zr_x Ti_y O_3$ (where $0.90 < a+x+y < 1.00$) is provided. The starting materials for the piezoelectric ceramic compound are calcined. The calcined material is milled to provide powder. A formed body containing the powder is provided. The formed body is degreased at a temperature having the formed body not sintered. A sintered body is provided by sintering the degreased body. The sintered body is heated to subject the sintered body to predetermined heat treatment. The sintered body subjected to the predetermined heat treatment is polarized to provide the sintered body with a piezoelectric property, thus providing a piezoelectric ceramic device. This piezoelectric ceramic composition can be sintered together with an electrode consisting mainly of Ag at a low temperature. Even after the sintering, the composition has its insulation resistance not decrease and has its piezoelectric properties not decline. The piezoelectric ceramic composition has its insulation resistance not decrease even in high-temperature and high-humidity condition, thus having stable characteristics.

11 Claims, 18 Drawing Sheets

Fig. 2

| Sample No. | Pb (mol) | Zn$_{1/3}$Nb$_{2/3}$ a(mol) | Zr x(mol) | Ti y(mol) | a+x+y (mol) | Sintering Temp. (°C) | Heat Treatment | Insulation Resistance (Ω) | |
|---|---|---|---|---|---|---|---|---|---|
| | | | | | | | | Before Polarization | After Humidity Test |
| 1(*) | 1.0 | 0.10 | 0.39 | 0.39 | 0.88 | 830 | Yes | 1.1×10$^8$ | 7.0×10$^7$ |
| 2(*) | | 0.10 | 0.40 | 0.40 | 0.90 | 840 | Yes | 1.3×10$^8$ | 1.3×10$^8$ |
| 3 | | 0.15 | 0.39 | 0.39 | 0.93 | 850 | Yes | 1.8×10$^9$ | 1.5×10$^9$ |
| 4 | | 0.15 | 0.40 | 0.40 | 0.95 | 860 | Yes | 2.5×10$^9$ | 1.0×10$^9$ |
| 5(**) | | 0.20 | 0.40 | 0.40 | 1.00 | 980 | Yes | 1.3×10$^9$ | 1.5×10$^9$ |
| 6(**) | | 0.20 | 0.42 | 0.41 | 1.03 | 1050 | Yes | 2.0×10$^9$ | 1.5×10$^9$ |
| 7(*) | 1.0 | 0.10 | 0.39 | 0.39 | 0.88 | 830 | None | 6.0×10$^7$ | <1.0×10$^6$ |
| 8(*) | | 0.10 | 0.40 | 0.40 | 0.90 | 840 | None | 1.2×10$^8$ | 1.4×10$^7$ |
| 9(*) | | 0.15 | 0.39 | 0.39 | 0.93 | 850 | None | 5.0×10$^8$ | 4.0×10$^7$ |
| 10(*) | | 0.15 | 0.40 | 0.40 | 0.95 | 860 | None | 2.0×10$^8$ | 1.0×10$^7$ |
| 11(**) | | 0.20 | 0.40 | 0.40 | 1.00 | 980 | None | 1.0×10$^9$ | 7.0×10$^9$ |
| 12(**) | | 0.20 | 0.42 | 0.41 | 1.03 | 1050 | None | 1.5×10$^9$ | 1.4×10$^9$ |

Fig. 3

| Sample No. | Pb (mol) | $Zn_{1/3}Nb_{2/3}$ a(mol) | Zr x(mol) | Ti y(mol) | a+x+y (mol) | Sintering Temp. (°C) | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|
| 13(*) | 1.0 | 0.10 | 0.45 | 0.44 | 0.99 | 890 | 350 | 1.0 | $4.0\times10^8$ | $8.0\times10^6$ |
| 14(*) | | | | | | | 400 | 1.0 | $5.0\times10^8$ | $4.0\times10^7$ |
| 15 | | | | | | | 450 | 1.0 | $1.3\times10^9$ | $1.3\times10^9$ |
| 16 | | | | | | | 500 | 1.0 | $1.2\times10^9$ | $1.4\times10^9$ |
| 17 | | | | | | | 550 | 1.0 | $1.8\times10^9$ | $1.5\times10^9$ |
| 18(*) | | | | | | | 600 | 0.2 | $2.0\times10^9$ | $4.0\times10^6$ |
| 19 | | | | | | | 600 | 1.0 | $2.5\times10^9$ | $1.0\times10^9$ |
| 20 | | | | | | | 600 | 3.0 | $1.5\times10^9$ | $1.0\times10^9$ |
| 21 | | | | | | | 600 | 5.0 | $2.0\times10^9$ | $1.0\times10^9$ |
| 22 | | | | | | | 650 | 1.0 | $2.0\times10^9$ | $1.0\times10^9$ |
| 23 | | | | | | | 700 | 1.0 | $2.0\times10^9$ | $1.3\times10^9$ |
| 24 | | | | | | | 750 | 1.0 | $1.3\times10^9$ | $1.3\times10^9$ |
| 25 | | | | | | | 800 | 1.0 | $1.0\times10^9$ | $1.3\times10^9$ |
| 26(*) | | | | | | | 850 | 1.0 | $4.0\times10^9$ | $4.0\times10^7$ |
| 27(*) | | | | | | | 900 | 1.0 | $5.0\times10^9$ | $4.0\times10^7$ |

Fig. 4

| Sample No. | Pb (mol) | $Zn_{1/3}Nb_{2/3}$ a(mol) | Zr x(mol) | Ti y(mol) | a+x+y (mol) | Sintering Temp. (°C) | Heat Treatment Temp. (°C) | Heat Treatment O₂ (kPa) | Insulation Resistance (Ω) Before Polarization | Insulation Resistance (Ω) After Humidity Test |
|---|---|---|---|---|---|---|---|---|---|---|
| 28(*) | 1.0 | 0.10 | 0.45 | 0.44 | 0.99 | 890 | 450 | 10 | $4.0 \times 10^7$ | $<1.0 \times 10^6$ |
| 29(*) | | | | | | | 500 | 10 | $2.0 \times 10^7$ | $<1.0 \times 10^6$ |
| 30(*) | | | | | | | 550 | 10 | $1.0 \times 10^7$ | $<1.0 \times 10^6$ |
| 31(*) | | | | | | | 650 | 10 | $1.5 \times 10^7$ | $<1.0 \times 10^6$ |
| 32(*) | | | | | | | 750 | 10 | $3.0 \times 10^7$ | $<1.0 \times 10^6$ |
| 33 | | | | | | | 450 | 20 | $1.3 \times 10^9$ | $1.3 \times 10^9$ |
| 34 | | | | | | | 500 | 20 | $1.2 \times 10^9$ | $1.4 \times 10^9$ |
| 35 | | | | | | | 550 | 20 | $1.8 \times 10^9$ | $1.5 \times 10^9$ |
| 36 | | | | | | | 650 | 20 | $2.0 \times 10^9$ | $1.0 \times 10^9$ |
| 37 | | | | | | | 750 | 20 | $1.3 \times 10^9$ | $1.3 \times 10^9$ |
| 38 | | | | | | | 450 | 35 | $4.5 \times 10^9$ | $2.0 \times 10^9$ |
| 39 | | | | | | | 500 | 35 | $5.0 \times 10^9$ | $5.0 \times 10^9$ |
| 40 | | | | | | | 550 | 35 | $8.0 \times 10^9$ | $7.0 \times 10^9$ |
| 41 | | | | | | | 650 | 35 | $5.0 \times 10^9$ | $4.0 \times 10^9$ |
| 42 | | | | | | | 750 | 35 | $5.0 \times 10^9$ | $2.0 \times 10^9$ |

Fig. 5

| Sample No. | Pb (mol) | $Zn_{1/3}Nb_{2/3}$ a(mol) | Zr x(mol) | Ti y(mol) | a+x+y (mol) | Sintering Temp. (°C) | Sintering Atmosphere | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|---|
| 43(*) | 1.0 | 0.10 | 0.43 | 0.45 | 0.98 | 780 | Closed | 600 | 1 | $4.0 \times 10^8$ | $8.0 \times 10^6$ |
| 44 | | | | | | 800 | Closed | 600 | 1 | $9.0 \times 10^9$ | $4.0 \times 10^9$ |
| 45 | | | | | | 830 | Closed | 600 | 1 | $5.0 \times 10^9$ | $1.3 \times 10^9$ |
| 46 | | | | | | 860 | Closed | 600 | 1 | $6.2 \times 10^9$ | $1.4 \times 10^9$ |
| 47 | | | | | | 890 | Closed | 600 | 1 | $1.8 \times 10^9$ | $1.5 \times 10^9$ |
| 48 | | | | | | 920 | Closed | 600 | 1 | $2.0 \times 10^9$ | $4.0 \times 10^9$ |
| 49(*) | | | | | | 950 | Closed | 600 | 1 | $9.3 \times 10^7$ | $1.0 \times 10^6$ |
| 50(*) | 1.0 | 0.10 | 0.43 | 0.45 | 0.98 | 780 | Opened | 600 | 1 | $1.5 \times 10^9$ | $1.0 \times 10^8$ |
| 51(*) | | | | | | 800 | Opened | 600 | 1 | $2.0 \times 10^9$ | $1.0 \times 10^8$ |
| 52(*) | | | | | | 830 | Opened | 600 | 1 | $2.0 \times 10^9$ | $1.0 \times 10^8$ |
| 53(*) | | | | | | 860 | Opened | 600 | 1 | $2.0 \times 10^9$ | $1.3 \times 10^8$ |
| 54(*) | | | | | | 890 | Opened | 600 | 1 | $2.5 \times 10^9$ | $8.5 \times 10^8$ |
| 55(*) | | | | | | 920 | Opened | 600 | 1 | $1.0 \times 10^8$ | $<1.0 \times 10^6$ |
| 56(*) | | | | | | 950 | Opened | 600 | 1 | $4.0 \times 10^7$ | $<1.0 \times 10^6$ |

Fig. 9

| Sample No. | Pb (mol) | $Zn_{1/3}Nb_{2/3}$ a(mol) | Zr x(mol) | Ti y(mol) | a+x+y (mol) | Sintering Temp. (°C) | Sintering Atmosphere | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|---|
| 57 | 1.0 | 0.100 | 0.45 | 0.44 | 0.99 | 860 | Closed | 450 | 1.0 | $4.0 \times 10^9$ | $8.0 \times 10^9$ |
| 58 | | | | | | | | 500 | 1.0 | $5.0 \times 10^9$ | $1.3 \times 10^9$ |
| 59 | | | | | | | | 550 | 1.0 | $1.3 \times 10^9$ | $3.0 \times 10^9$ |
| 60 | | | | | | | | 600 | 1.0 | $4.0 \times 10^9$ | $3.5 \times 10^9$ |
| 61 | | | | | | | | 650 | 1.0 | $1.8 \times 10^9$ | $1.5 \times 10^9$ |
| 62 | | | | | | | | 700 | 1.0 | $2.0 \times 10^9$ | $1.5 \times 10^9$ |
| 63 | | | | | | | | 750 | 1.0 | $2.5 \times 10^9$ | $1.5 \times 10^9$ |
| 64 | | | | | | | | 800 | 1.0 | $1.5 \times 10^9$ | $1.0 \times 10^9$ |
| 65(*) | | | | | | | | 850 | 1.0 | $8.0 \times 10^6$ | $<1.0 \times 10^6$ |
| 66(*) | 1.0 | 0.100 | 0.45 | 0.44 | 0.99 | 860 | Opened | 450 | 1.0 | $8.0 \times 10^6$ | $<1.0 \times 10^6$ |
| 67(*) | | | | | | | | 500 | 1.0 | $8.0 \times 10^6$ | $<1.0 \times 10^6$ |
| 68(*) | | | | | | | | 550 | 1.0 | $8.0 \times 10^7$ | $<1.0 \times 10^6$ |
| 69(*) | | | | | | | | 600 | 1.0 | $8.0 \times 10^8$ | $2.1 \times 10^7$ |
| 70(*) | | | | | | | | 650 | 1.0 | $5.0 \times 10^8$ | $3.6 \times 10^7$ |
| 71(*) | | | | | | | | 700 | 1.0 | $4.5 \times 10^8$ | $3.6 \times 10^7$ |
| 72(*) | | | | | | | | 750 | 1.0 | $4.8 \times 10^8$ | $5.6 \times 10^7$ |
| 73(*) | | | | | | | | 800 | 1.0 | $8.0 \times 10^8$ | $<1.0 \times 10^6$ |
| 74(*) | | | | | | | | 850 | 1.0 | $2.5 \times 10^8$ | $<1.0 \times 10^6$ |

Fig. 10

| Sample No. | Pb (mol) | $Zn_{1/3}Nb_{2/3}$ a(mol) | Zr x(mol) | Ti y(mol) | a+x+y (mol) | Sintering Temp. (°C) | Sintering Atmosphere | Heat Treatment Temp. (°C) | Heat Treatment Duration (hr) | Heat Treatment $O_2$ (kPa) | Insulation Resistance (Ω) Before Polarization | Insulation Resistance (Ω) After Humidity Test |
|---|---|---|---|---|---|---|---|---|---|---|---|---|
| 75(*) | 1.0 | 0.100 | 0.45 | 0.44 | 0.99 | 860 | Closed | 550 | 1 | 10 | $3.5 \times 10^8$ | $2.6 \times 10^6$ |
| 76(*) | | | | | | | Opened | 550 | 1 | 10 | $1.8 \times 10^7$ | $<1.0 \times 10^6$ |
| 77 | | | | | | | Closed | 550 | 1 | 20 | $1.3 \times 10^9$ | $3.0 \times 10^9$ |
| 78(*) | | | | | | | Opened | 550 | 1 | 20 | $8.0 \times 10^7$ | $<1.0 \times 10^6$ |
| 79 | | | | | | | Closed | 550 | 1 | 30 | $4.0 \times 10^9$ | $1.0 \times 10^9$ |
| 80(*) | | | | | | | Opened | 550 | 1 | 30 | $2.0 \times 10^9$ | $1.3 \times 10^8$ |

Fig. 11

| Sample No. | Pb (mol) | $Zn_{1/3}Nb_{2/3}$ a(mol) | Zr x(mol) | Ti y(mol) | a+x+y (mol) | Sintering Temp. (°C) | Sintering Atmosphere | Heat Treatment Temp. (°C) | Heat Treatment Duration (hr) | Heat Treatment $O_2$ (kPa) | Insulation Resistance (Ω) Before Polarization | Insulation Resistance (Ω) After Humidity Test |
|---|---|---|---|---|---|---|---|---|---|---|---|---|
| 81(*) | 1.0 | 0.100 | 0.45 | 0.44 | 0.99 | 780 | Closed | 600 | 1 | 20 | $4.0 \times 10^9$ | $8.0 \times 10^7$ |
| 82 | | | | | | 800 | Closed | 600 | 1 | 20 | $5.0 \times 10^9$ | $3.8 \times 10^9$ |
| 83 | | | | | | 830 | Closed | 600 | 1 | 20 | $5.5 \times 10^9$ | $1.3 \times 10^9$ |
| 84 | | | | | | 860 | Closed | 600 | 1 | 20 | $4.0 \times 10^9$ | $3.5 \times 10^9$ |
| 85 | | | | | | 890 | Closed | 600 | 1 | 20 | $1.8 \times 10^9$ | $1.5 \times 10^9$ |
| 86 | | | | | | 920 | Closed | 600 | 1 | 20 | $8.0 \times 10^9$ | $4.0 \times 10^9$ |
| 87(*) | | | | | | 950 | Closed | 600 | 1 | 20 | $2.5 \times 10^8$ | $1.0 \times 10^7$ |
| 88(*) | 1.0 | 0.100 | 0.45 | 0.44 | 0.99 | 780 | Opened | 600 | 1 | 20 | $1.5 \times 10^9$ | $1.0 \times 10^7$ |
| 89(*) | | | | | | 800 | Opened | 600 | 1 | 20 | $2.0 \times 10^8$ | $1.0 \times 10^7$ |
| 90(*) | | | | | | 830 | Opened | 600 | 1 | 20 | $2.0 \times 10^8$ | $1.5 \times 10^7$ |
| 91(*) | | | | | | 860 | Opened | 600 | 1 | 20 | $8.0 \times 10^8$ | $2.1 \times 10^7$ |
| 92(*) | | | | | | 890 | Opened | 600 | 1 | 20 | $1.3 \times 10^8$ | $1.3 \times 10^7$ |
| 93(*) | | | | | | 920 | Opened | 600 | 1 | 20 | $1.0 \times 10^8$ | $3.5 \times 10^7$ |
| 94(*) | | | | | | 950 | Opened | 600 | 1 | 20 | $8.5 \times 10^7$ | $4.0 \times 10^6$ |

Fig. 12

| Sample No. | Pb (mol) | Zn$_{1/3}$Nb$_{2/3}$ a(mol) | Zr x(mol) | Ti y(mol) | a+x+y (mol) | MnO$_2$ α(wt.%) | Sintering Temp. (°C) | Heat Treatment | Insulation Resistance (Ω) | |
|---|---|---|---|---|---|---|---|---|---|---|
| | | | | | | | | | Before Polarization | After Humidity Test |
| 95(*) | 1.0 | 0.100 | 0.39 | 0.39 | 0.88 | 0.01 | 830 | Yes | 1.1×10$^8$ | 7.0×10$^7$ |
| 96(*) | | 0.100 | 0.40 | 0.40 | 0.90 | 0.05 | 840 | Yes | 1.3×10$^8$ | 1.3×10$^8$ |
| 97 | | 0.150 | 0.39 | 0.39 | 0.93 | 0.10 | 850 | Yes | 1.8×10$^9$ | 1.5×10$^9$ |
| 98 | | 0.150 | 0.40 | 0.40 | 0.95 | 0.50 | 860 | Yes | 2.5×10$^9$ | 1.0×10$^9$ |
| 99(**) | | 0.200 | 0.40 | 0.40 | 1.00 | 1.00 | 980 | Yes | 1.3×10$^9$ | 1.5×10$^9$ |
| 100(**) | | 0.200 | 0.42 | 0.41 | 1.03 | 1.50 | 1050 | Yes | 2.0×10$^9$ | 1.5×10$^9$ |
| 101(*) | | 0.100 | 0.39 | 0.39 | 0.88 | 1.90 | 830 | None | 6.0×10$^7$ | <1.0×10$^6$ |
| 102(*) | | 0.100 | 0.40 | 0.40 | 0.90 | 2.00 | 840 | None | 1.2×10$^8$ | 1.4×10$^7$ |
| 103(*) | | 0.150 | 0.39 | 0.39 | 0.93 | 2.10 | 850 | None | 5.0×10$^8$ | 4.0×10$^7$ |
| 104(*) | | 0.150 | 0.40 | 0.40 | 0.95 | 2.30 | 860 | None | 2.0×10$^8$ | 1.0×10$^7$ |

Fig. 13

| Sample No. | Pb (mol) | $Zn_{1/3}Nb_{2/3}$ a(mol) | Zr x(mol) | Ti y(mol) | a+x+y (mol) | $MnO_2$ α(wt.%) | Sintering Temp. (°C) | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|---|
| 105(*) | 1.0 | 0.10 | 0.44 | 0.44 | 0.98 | 0.25 | 860 | 350 | 1.0 | $2.0 \times 10^8$ | $3.0 \times 10^6$ |
| 106(*) | | | | | | | | 400 | 1.0 | $3.8 \times 10^8$ | $4.0 \times 10^7$ |
| 107 | | | | | | | | 450 | 1.0 | $5.0 \times 10^9$ | $3.6 \times 10^9$ |
| 108 | | | | | | | | 500 | 1.0 | $4.6 \times 10^9$ | $2.6 \times 10^9$ |
| 109 | | | | | | | | 550 | 1.0 | $3.3 \times 10^9$ | $3.0 \times 10^9$ |
| 110(*) | | | | | | | | 600 | 0.2 | $3.5 \times 10^9$ | $6.0 \times 10^6$ |
| 111 | | | | | | | | 600 | 1.0 | $3.5 \times 10^9$ | $2.0 \times 10^9$ |
| 112 | | | | | | | | 600 | 3.0 | $4.2 \times 10^9$ | $3.5 \times 10^9$ |
| 113 | | | | | | | | 600 | 5.0 | $2.9 \times 10^9$ | $2.0 \times 10^9$ |
| 114 | | | | | | | | 650 | 1.0 | $6.0 \times 10^9$ | $4.3 \times 10^9$ |
| 115 | | | | | | | | 700 | 1.0 | $5.4 \times 10^9$ | $2.2 \times 10^9$ |
| 116 | | | | | | | | 750 | 1.0 | $3.3 \times 10^9$ | $2.5 \times 10^9$ |
| 117 | | | | | | | | 800 | 1.0 | $2.0 \times 10^9$ | $1.3 \times 10^9$ |
| 118(*) | | | | | | | | 850 | 1.0 | $4.0 \times 10^9$ | $4.0 \times 10^7$ |
| 119(*) | | | | | | | | 900 | 1.0 | $5.0 \times 10^9$ | $4.0 \times 10^7$ |

Fig. 14

| Sample No. | Pb (mol) | Zn₁/₃Nb₂/₃ a(mol) | Zr x(mol) | Ti y(mol) | a+x+y (mol) | MnO₂ α(wt.%) | Sintering Temp. (°C) | Heat Treatment Temp. (°C) | Heat Treatment O₂ (kPa) | Insulation Resistance (Ω) Before Polarization | Insulation Resistance (Ω) After Humidity Test |
|---|---|---|---|---|---|---|---|---|---|---|---|
| 120(*) | 1.0 | 0.10 | 0.44 | 0.44 | 0.98 | 0.25 | 860 | 450 | 10 | 9.0×10⁷ | <1.0×10⁶ |
| 121(*) | | | | | | | | 500 | 10 | 3.0×10⁷ | <1.0×10⁶ |
| 122(*) | | | | | | | | 550 | 10 | 2.6×10⁷ | <1.0×10⁶ |
| 123(*) | | | | | | | | 650 | 10 | 3.2×10⁷ | <1.0×10⁶ |
| 124(*) | | | | | | | | 750 | 10 | 2.3×10⁷ | <1.0×10⁶ |
| 125 | | | | | | | | 450 | 20 | 5.0×10⁹ | 3.6×10⁹ |
| 126 | | | | | | | | 500 | 20 | 4.6×10⁹ | 2.6×10⁹ |
| 127 | | | | | | | | 550 | 20 | 3.3×10⁹ | 3.0×10⁹ |
| 128 | | | | | | | | 650 | 20 | 6.0×10⁹ | 4.3×10⁹ |
| 129 | | | | | | | | 750 | 20 | 3.3×10⁹ | 2.5×10⁹ |
| 130 | | | | | | | | 450 | 35 | 8.5×10⁹ | 4.0×10⁹ |
| 131 | | | | | | | | 500 | 35 | 7.5×10⁹ | 5.0×10⁹ |
| 132 | | | | | | | | 550 | 35 | 6.2×10⁹ | 5.0×10⁹ |
| 133 | | | | | | | | 650 | 35 | 6.2×10⁹ | 5.4×10⁹ |
| 134 | | | | | | | | 750 | 35 | 3.5×10⁹ | 2.0×10⁹ |

Fig. 15

| Sample No. | Pb (mol) | $Zn_{1/3}Nb_{2/3}$ a(mol) | Zr x(mol) | Ti y(mol) | a+x+y (mol) | $MnO_2$ α(wt.%) | Sintering Temp. (°C) | Sintering Atmosphere | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|---|---|
| 135(*) | 1.0 | 0.10 | 0.43 | 0.45 | 0.98 | 0.30 | 780 | Closed | 600 | 1 | $8.0×10^8$ | $8.0×10^6$ |
| 136 | 1.0 | 0.10 | 0.43 | 0.45 | 0.98 | 0.30 | 800 | Closed | 600 | 1 | $8.5×10^9$ | $4.0×10^9$ |
| 137 | 1.0 | 0.10 | 0.43 | 0.45 | 0.98 | 0.30 | 830 | Closed | 600 | 1 | $3.5×10^9$ | $1.3×10^9$ |
| 138 | 1.0 | 0.10 | 0.43 | 0.45 | 0.98 | 0.30 | 860 | Closed | 600 | 1 | $5.7×10^9$ | $1.4×10^9$ |
| 139 | 1.0 | 0.10 | 0.43 | 0.45 | 0.98 | 0.30 | 890 | Closed | 600 | 1 | $3.6×10^9$ | $1.5×10^9$ |
| 140 | 1.0 | 0.10 | 0.43 | 0.45 | 0.98 | 0.30 | 920 | Closed | 600 | 1 | $4.0×10^9$ | $4.0×10^9$ |
| 141(*) | 1.0 | 0.10 | 0.43 | 0.45 | 0.98 | 0.30 | 950 | Closed | 600 | 1 | $8.8×10^8$ | $9.8×10^6$ |
| 142(*) | 1.0 | 0.10 | 0.43 | 0.45 | 0.98 | 0.30 | 780 | Opened | 600 | 1 | $2.0×10^9$ | $1.1×10^8$ |
| 143(*) | 1.0 | 0.10 | 0.43 | 0.45 | 0.98 | 0.30 | 800 | Opened | 600 | 1 | $2.4×10^9$ | $1.5×10^8$ |
| 144(*) | 1.0 | 0.10 | 0.43 | 0.45 | 0.98 | 0.30 | 830 | Opened | 600 | 1 | $3.0×10^9$ | $2.0×10^8$ |
| 145(*) | 1.0 | 0.10 | 0.43 | 0.45 | 0.98 | 0.30 | 860 | Opened | 600 | 1 | $5.0×10^9$ | $8.0×10^8$ |
| 146(*) | 1.0 | 0.10 | 0.43 | 0.45 | 0.98 | 0.30 | 890 | Opened | 600 | 1 | $4.3×10^9$ | $<1.0×10^6$ |
| 147(*) | 1.0 | 0.10 | 0.43 | 0.45 | 0.98 | 0.30 | 920 | Opened | 600 | 1 | $2.5×10^8$ | $<1.0×10^6$ |
| 148(*) | 1.0 | 0.10 | 0.43 | 0.45 | 0.98 | 0.30 | 950 | Opened | 600 | 1 | $1.0×10^7$ | $<1.0×10^6$ |

Fig. 18

| Sample No. | Pb (mol) | Zn$_{1/3}$Nb$_{2/3}$ a(mol) | Zr x(mol) | Ti y(mol) | a+x+y (mol) | MnO$_2$ α(wt%) | Sintering Temp. (°C) | Sintering Atmosphere | Heat Treatment Temp. (°C) | Heat Treatment Duration (hr) | Insulation Resistance (Ω) Before Polarization | Insulation Resistance (Ω) After Humidity Test |
|---|---|---|---|---|---|---|---|---|---|---|---|---|
| 149 | 1.0 | 0.100 | 0.45 | 0.44 | 1.55 | 0.50 | 830 | Closed | 450 | 1.0 | 3.0×10$^9$ | 1.2×10$^9$ |
| 150 | | | | | | | | | 500 | 1.0 | 6.0×10$^9$ | 3.2×10$^9$ |
| 151 | | | | | | | | | 550 | 1.0 | 7.0×10$^9$ | 4.5×10$^9$ |
| 152 | | | | | | | | | 600 | 1.0 | 9.0×10$^9$ | 8.5×10$^9$ |
| 153 | | | | | | | | | 650 | 1.0 | 8.8×10$^9$ | 6.5×10$^9$ |
| 154 | | | | | | | | | 700 | 1.0 | 3.7×10$^9$ | 3.6×10$^9$ |
| 155 | | | | | | | | | 750 | 1.0 | 2.5×10$^9$ | 2.3×10$^9$ |
| 156 | | | | | | | | | 800 | 1.0 | 1.5×10$^9$ | 1.5×10$^9$ |
| 157(*) | | | | | | | | | 850 | 1.0 | 8.0×10$^6$ | <1.0×10$^6$ |
| 158(*) | 1.0 | 0.100 | 0.45 | 0.44 | 1.55 | 0.50 | 830 | Opened | 450 | 1.0 | 6.0×10$^6$ | <1.0×10$^6$ |
| 159(*) | | | | | | | | | 500 | 1.0 | 6.3×10$^6$ | <1.0×10$^6$ |
| 160(*) | | | | | | | | | 550 | 1.0 | 8.5×10$^7$ | <1.0×10$^6$ |
| 161(*) | | | | | | | | | 600 | 1.0 | 9.0×10$^8$ | 3.0×10$^6$ |
| 162(*) | | | | | | | | | 650 | 1.0 | 3.5×10$^8$ | 1.3×10$^7$ |
| 163(*) | | | | | | | | | 700 | 1.0 | 7.6×10$^8$ | 5.6×10$^7$ |
| 164(*) | | | | | | | | | 750 | 1.0 | 8.6×10$^8$ | 1.3×10$^7$ |
| 165(*) | | | | | | | | | 800 | 1.0 | 9.0×10$^8$ | <1.0×10$^6$ |
| 166(*) | | | | | | | | | 850 | 1.0 | 3.3×10$^8$ | <1.0×10$^6$ |

Fig. 19

| Sample No. | Pb (mol) | Zn$_{1/3}$Nb$_{2/3}$ a(mol) | Zr x(mol) | Ti y(mol) | a+x+y (mol) | MnO$_2$ α(wt%) | Sintering Temp. (°C) | Sintering Atmosphere | Heat Treatment Temp. (°C) | Heat Treatment Duration (hr) | Heat Treatment O$_2$ (kPa) | Insulation Resistance (Ω) Before Polarization | Insulation Resistance (Ω) After Humidity Test |
|---|---|---|---|---|---|---|---|---|---|---|---|---|---|
| 167(*) | 1.0 | 0.100 | 0.45 | 0.44 | 1.55 | 0.50 | 830 | Closed | 550 | 1 | 10 | 8.6×10$^7$ | <1.0×10$^6$ |
| 168(*) | | | | | | | | Opened | 550 | 1 | 10 | 4.5×10$^6$ | <1.0×10$^6$ |
| 169 | | | | | | | | Closed | 550 | 1 | 20 | 7.0×10$^9$ | 4.5×10$^9$ |
| 170(*) | | | | | | | | Opened | 550 | 1 | 20 | 8.5×10$^7$ | <1.0×10$^6$ |
| 171 | | | | | | | | Closed | 550 | 1 | 30 | 5.4×10$^9$ | 1.1×10$^9$ |
| 172(*) | | | | | | | | Opened | 550 | 1 | 30 | 2.9×10$^9$ | 2.6×10$^8$ |

Fig. 20

| Sample No. | Pb (mol) | Zn$_{1/3}$Nb$_{2/3}$ a(mol) | Zr x(mol) | Ti y(mol) | a+x+y (mol) | MnO$_2$ α(wt%) | Sintering Temp. (°C) | Sintering Atmosphere | Heat Treatment Temp. (°C) | Heat Treatment Duration (hr) | Heat Treatment O$_2$ (kPa) | Insulation Resistance Before Polarization | Insulation Resistance After Humidity Test |
|---|---|---|---|---|---|---|---|---|---|---|---|---|---|
| 173(*) | 1.0 | 0.100 | 0.45 | 0.44 | 1.55 | 0.50 | 780 | Closed | 600 | 1 | 20 | 8.7×10$^9$ | 8.0×10$^7$ |
| 174 | | | | | | | 800 | Closed | 600 | 1 | 20 | 8.6×10$^9$ | 6.7×10$^8$ |
| 175 | | | | | | | 830 | Closed | 600 | 1 | 20 | 9.0×10$^9$ | 8.5×10$^9$ |
| 176 | | | | | | | 860 | Closed | 600 | 1 | 20 | 7.5×10$^9$ | 3.5×10$^9$ |
| 177 | | | | | | | 890 | Closed | 600 | 1 | 20 | 4.2×10$^9$ | 2.4×10$^9$ |
| 178 | | | | | | | 920 | Closed | 600 | 1 | 20 | 3.4×10$^9$ | 3.0×10$^9$ |
| 179(*) | | | | | | | 950 | Closed | 600 | 1 | 20 | 2.4×10$^8$ | 3.1×10$^6$ |
| 180(*) | 1.0 | 0.100 | 0.45 | 0.44 | 1.55 | 0.50 | 780 | Opened | 600 | 1 | 20 | 2.4×10$^9$ | 1.5×10$^7$ |
| 181(*) | | | | | | | 800 | Opened | 600 | 1 | 20 | 2.0×10$^8$ | 1.0×10$^7$ |
| 182(*) | | | | | | | 830 | Opened | 600 | 1 | 20 | 9.0×10$^8$ | 3.0×10$^6$ |
| 183(*) | | | | | | | 860 | Opened | 600 | 1 | 20 | 4.5×10$^9$ | 2.5×10$^7$ |
| 184 | | | | | | | 890 | Opened | 600 | 1 | 20 | 7.5×10$^8$ | 5.2×10$^7$ |
| 185(*) | | | | | | | 920 | Opened | 600 | 1 | 20 | 3.0×10$^8$ | 1.2×10$^7$ |
| 186(*) | | | | | | | 950 | Opened | 600 | 1 | 20 | 9.1×10$^7$ | 3.3×10$^6$ |

METHOD OF PRODUCING PIEZOELECTRIC CERAMIC DEVICE

FIELD OF THE INVENTION

The present invention relates to a method of producing a piezoelectric ceramic device having a multi-layer construction, such as a piezoelectric transducer, a piezoelectric actuator, or a piezoelectric transformer.

BACKGROUND OF THE INVENTION

Piezoelectric ceramic compositions have widely been used in piezoelectric ceramic devices, such as a piezoelectric transducer, a piezoelectric filer, a piezoelectric actuator, a piezoelectric transformer, and a piezoelectric buzzer. As piezoelectric ceramic devices are demanded to have small overall sizes, thicknesses, and high performance, various multi-layer structures have been developed.

Conventional piezoelectric ceramic composition is sintered at a high temperature, hence causing a sintering furnace to consume a large electric energy. Further, a piezoelectric ceramic device having the multi-layer structure commonly employs platinum or palladium as material of its internal electrodes, which is expensive and has a high melting point, hence being produced expensively.

A conventional piezoelectric ceramic composition which can be sintered at a comparatively low temperature is disclosed in Japanese Patent Laid-Open Publication No. 9-169566. This composition consists mainly of composite oxides having perovskite structures containing Pb, Zr, and Ti, and is doped with Cu and W. A piezoelectric ceramic device having a multi-layer structure employing this composition can employ less expensive silver-palladium alloy as material of its internal electrode.

While the conventional piezoelectric ceramic composition can be sintered at a low temperature of 1100° C., a device including internal electrodes containing more than 90% of Ag can not be sintered and has unstable characteristics in high-temperature and high-humidity condition.

Another conventional piezoelectric ceramic composition which reduces the content of palladium in internal electrodes and which can be sintered at a lower temperature is disclosed in Japanese Patent Laid-Open Publication No. 10-7458. This composition consists mainly of $PbTiO_3$—$PbZrO_3$—$Pb(Mn_{1/3}Nb_{2/3})$—$Pb(Co_{1/3}Nb_{2/3})O_3$ and is doped with CoO and PbO.

This piezoelectric ceramic composition can be sintered at a low temperature of 930° C., however it has a low, unstable insulation resistance under high-temperature and high-humidity condition.

Among piezoelectric ceramic composition having a perovskite crystalline structure of $PbTiO_3$ and $PbZrO_3$, composition having a ratio A/B exceeds 1.00, where A is the content of Pb and B is the content of Zr and Ti, i.e., non-stoichiometry or a surplus of A can be sintered at a lower temperature than composition having the ratio A/B not greater than 1.00. However, the composition having the ratio A/B exceeding 1.00 has an insulation resistance decrease after the sintering. This composition accordingly disables a predetermined voltage to be applied to the composition, hence having its piezoelectric properties decline. Particularly in high-temperature and high-humidity condition, the composition has the insulation resistance decrease from that at an initial status.

SUMMARY OF THE INVENTION

A piezoelectric ceramic compound expressed by a basic formula of $Pb(Zn_{1/3}Nb_{2/3})_aZr_xTi_yO_3$ (where $0.90<a+x+y<1.00$) is provided. The starting materials for the piezoelectric ceramic compound are calcined. The calcined material is milled to provide powder. A formed body containing the powder is provided. The formed body is degreased at a temperature having the formed body not sintered. A sintered body is provided by sintering the degreased body. The sintered body is heated to subject the sintered body to predetermined heat treatment. The sintered body subjected to the predetermined heat treatment is polarized to provide the sintered body with a piezoelectric property, thus providing a piezoelectric ceramic device.

This piezoelectric ceramic composition can be sintered together with an inner electrode consisting mainly of Ag at a low temperature. Even after the sintering, the insulation resistance of the composition does not decrease and its piezoelectric properties do not decline. The insulation resistance of the piezoelectric ceramic composition does not decrease even in high-temperature and high-humidity condition, thus having stable characteristics.

BRIEF DESCRIPTION OF THE DRAWINGS

FIGS. 2-5 illustrate compositions and resultant measurements of the piezoelectric ceramic composition according to Embodiment 1.

FIGS. 9-11 illustrate compositions and resultant measurements of the piezoelectric ceramic composition according to Embodiment 2.

FIGS. 12-15 illustrate compositions and resultant measurements of the piezoelectric ceramic composition according to Embodiment 3.

FIGS. 18-20 illustrate compositions and resultant measurements of the piezoelectric ceramic composition according to Embodiment 4.

DETAILED DESCRIPTION OF THE PREFERRED EMBODIMENTS

Exemplary Embodiment 1

Figure 1:
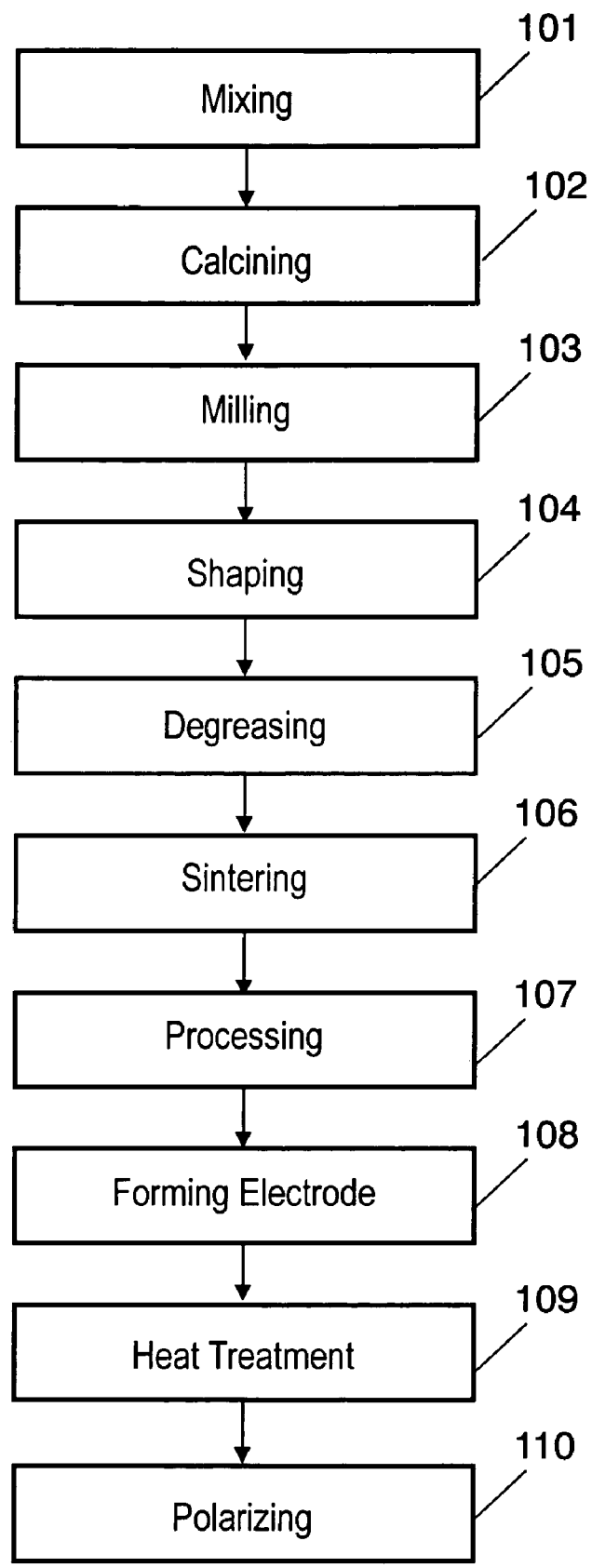
FIG. 1 illustrates processes for producing piezoelectric ceramic composition according to Exemplary Embodiments 1 and 3 of the present invention.

FIG. 1 illustrates processes for producing a piezoelectric ceramic composition used in a piezoelectric ceramic device according to Exemplary Embodiment 1 of the present invention. Powders of lead oxide (PbO), titanium oxide ($TiO_2$), zirconium oxide ($ZrO_2$), zinc oxide (ZnO), and niobium oxide ($Nb_2O_5$) as material of piezoelectric ceramic composition expressed by a basic formula, $Pb(Zn_{1/3}Nb_{2/3})_aZr_xTi_yO_3$ are weighed at the molar ratio of the metallic powders shown in FIG. 2. The powders are put with water and partially stabilizing zirconium balls as mediums into a pot mill and wet-mixed by spinning the pot mill for twenty hours (Step 101). The weight ratio between the materials to the water is 1:1, and the zirconium balls have diameters not greater than 5 mm.

Slurry provided by the wet-mixing of the powders is transferred into a flat-bottomed container, such as a stainless-steel tray, and is dried at 200° C. in a drier for a whole day. The dried slurry is ground in a mortar and transferred into a crucible made of alumina, and then is calcined at a temperature-rising speed of 200° C./hour at 850° C. for two hours, thus providing calcined powder (Step 102).

Then, the calcined powder is milled in a mill, such as a rotor mill or a disk mill, and is transferred into a pot mill to wet-mill the powder for ten hours similarly to the mixing at Step 101, thus providing slurry. The slurry of the powder is transferred into a flat-bottom container, such as a stainless tray, and is dried at 200° C. in a drier for a whole day, thus providing ceramic powder (Step 103).

Then, the ceramic powder is then mixed with polyvinyl alcohol binder, and press-formed by a pressure of about 100 MPa to provide a formed body having a disk shape having a diameter of 20 mm and a thickness of 1.3 mm (Step 104).

The formed body is mounted to a sagger made of alumina and heated at 500° C. in an electric furnace for two hours to remove the binder from the body (Step 105). The formed body is placed in another electric furnace and is sintered at a predetermined temperature for two hours, thus providing a sintered body made of piezoelectric ceramic composition having the disk shape (Step 106).

The sintered body of the piezoelectric ceramic composition having the disk shape is polished to provide a piezoelectric ceramic having a thickness of 0.5 mm with a grinder (Step 107).

The piezoelectric ceramic is provided with a silver paste applied thereon and is sintered at about 700° C. for ten minutes to form an electrode (Step 108).

The piezoelectric ceramic having the electrode thereon is heated at a temperature-rising speed of 200° C./hour and held at a maximum temperature of 650° C. for one hour in an electric furnace for heat treatment (Step 109). The piezoelectric ceramic after the heat treatment is immersed in silicone oil at 100° C., and a voltage of 3 kV per a thickness of 1 mm is applied to the ceramic to polarize the ceramic to provide the ceramic with a piezoelectric property, thus providing a piezoelectric ceramic element (Step 110). The polarized element is then left at the room temperature for a time longer than twenty four hours.

Samples of piezoelectric ceramic elements produced by the above method were evaluated. FIGS. 2-5 illustrate insulation resistances of the samples of the piezoelectric ceramic element before the polarization at Step 110. The samples were left under conditions of a high temperature (120° C.), a high humidity (100%), and a high atmospheric pressure (2 atm), and the insulation resistances are then measured. In FIGS. 2-5, defective samples having an insulating resistance not higher than $10^8\Omega$ are marked with "*", and samples which were sintered at a temperature higher than 930° C. are marked with "**". In FIG. 2, a temperature at the heat treatment at Step 109 was 650° C., and sintering temperatures are minimum temperatures to provide the samples of the piezoelectric ceramic element with densities not smaller than 7500 kg/m³. In FIGS. 2-5, the piezoelectric ceramic composition is expressed as a basic formula of $Pb(Zn_{1/3}Nb_{2/3})_aZr_xTi_yO_3$, where "a" is a molar ratio of $Zn_{1/3}Nb_{2/3}$, "x" is a molar ratio of Zr, and "y" is a molar ratio of Ti while a molar ratio of Pb is "1".

Samples Nos. 3 and 4 specified by $0.90<a+x+y<1.0$ and subjected to the heat treatment at Step 109 were sintered at sintering temperatures not higher than 930° C. before the polarization, and have insulation resistances before the polarization which are not lower than $10^9\Omega$, and insulation resistances after a left-in-high-humidity test to leave samples at a high temperature (120° C.), a high humidity (100%), and a high atmospheric pressure (2 atm) which are not lower than $10^9\Omega$, thus having target characteristics.

Samples Nos. 7-10 which were not subjected to the heat treatment at Step 109 have insulation resistances lower than $10^8\Omega$ before the polarization, thus not having the target characteristics.

Samples Nos. 1 and 2 specified by $a+x+y\leq 0.90$ fail to compensate defect of oxygen caused at the sintering even by the heat treatment, and have insulation resistances lower than $10^8\Omega$ before the polarization at Step 110, thus not being preferable.

Samples Nos. 5, 6, 11, and 12 specified by $a+x+y\geq 1.0$ were not sintered at temperatures ranging from 800° C. to 930° C., which allow the samples to be sintered with inexpensive internal electrodes containing not smaller than 95% of Ag, thus being inappropriate for the piezoelectric ceramic composition according to Embodiment 1.

In order to obtain piezoelectric ceramic composition having a sintering temperature not higher than 930° C. and stable characteristics, a temperature at the heat treatment at Step 109 was studied for determining an appropriate range of the temperature.

Powders of PbO, $TiO_2$, $ZrO_2$, ZnO, and $Nb_2O_5$ were weighed and mixed such that metallic elements of them exhibit the composition shown in FIG. 3, and samples of piezoelectric ceramic composition shown in FIG. 3 were produced by the method shown in FIG. 1. The samples were subjected to the heat treatment at Step 109 at temperatures and durations of time shown in FIG. 3. The temperatures for the heat treatment shown in FIG. 3 are maximum temperatures while the samples were left at the maximum temperatures for the durations. A temperature-rising speed and a temperature-falling speed from the maximum temperatures were 200° C./hour. The samples were then examined in insulation resistances before the polarization and in insulation resistances after the left-in-high-humidity test.

As shown in FIG. 3, the samples Nos. 15-17 and 19-25 were subjected to the heat treatment at temperatures ranging from 450° C. to 800° C. for durations longer than one hour. These samples have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 13 and 14 fail to compensate for defect of oxygen caused by the sintering and are in semiconductor state, having insulation resistances of $10^8\Omega$ before the polarization and insulation resistances not higher than $10^7\Omega$ after the left-in-high-humidity test, thus not being preferable.

Sample No. 18 subjected to the heat treatment for a short duration of 0.2 hour at Step 109 has a high insulation resistance of $10^9\Omega$ before the polarization, and however, has a low insulation resistance lower than $10^7\Omega$ after the left-in-high-humidity test, thus not being preferable.

Samples Nos. 26 and 27 which were heat-treated at a temperature not lower than 850° C. have high insulation resistances of $10^9\Omega$ before the polarization, and however, have low insulation resistances lower than $10^7\Omega$ after the left-in-high-humidity test, thus not being preferable. Since the temperature not lower than 850° C. at the heat treatment is close to the sintering temperature, the heat treatment at Step 109 causes irregular granular growth and re-sintering during the heat treatment, thus causing this result.

In order to obtain piezoelectric ceramic composition having a sintering temperature not higher than 930° C. and stable characteristics, an appropriate temperature and an appropriate concentration of oxygen in atmosphere at the heat treatment were studied. Powders of PbO, $TiO_2$, $ZrO_2$, ZnO, and $Nb_2O_5$ were weighed and mixed such that metallic elements of the oxides exhibit the composition shown in FIG. 4, and samples of the piezoelectric ceramic composition were produced by the method shown in FIG. 1. The samples were subjected to the heat treatment at Step 109 at temperatures at partial pressures of oxygen shown in FIG. 4. Each temperature at the heat treatment was maintained for one hour.

Samples Nos. 33-42 which were subjected to the heat treatment at partial pressures of oxygen at the heat treatment not lower than 20 kPa have insulation resistance not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 28-32 which were subjected to the heat treated at partial pressures of oxygen of 10 kPa at temperatures ranging from 450° C. to 750° C. have insulation resistances of $10^7\Omega$ before the polarization and insulation resistances lower than $10^6\Omega$ after the left-in-high-humidity test, thus not being preferable.

In order to obtain piezoelectric ceramic composition having a sintering temperature not higher than 930° C. and stable characteristics, an appropriate sintering temperature and an appropriate atmosphere at the sintering at Step 106 shown in FIG. 1 was studied. Powders of PbO, $TiO_2$, $ZrO_2$, ZnO, and $Nb_2O_5$ were weighed and mixed such that metallic elements of the oxides exhibit compositions shown in FIG. 5, and were sintered at Step 106 at temperatures and atmospheres shown in FIG. 5. Then, samples of piezoelectric ceramic element were produced by the method shown in FIG. 1. Sintering temperatures shown in FIG. 5 are maximum temperatures during the sintering at Step 106 and were maintained at the maximum temperatures for two hours. Formed bodies provided were sintered in a fire-resistant container with a cover. Atmosphere during the sintering was studied in two methods; a closed sintering to bake samples in the container closed with the cover; and an opened sintering to bake samples in the container in an opened atmosphere.

Samples Nos. 44-48 which were sintered at temperatures shown in FIG. 5 by the closed sintering and which were subjected to the heat treatment at 600° C. for one hour have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 43 and 49 which were sintered at a temperature lower than 800° C. and at a temperature not lower than 950° C., respectively, have insulation resistances lower than $10^9\Omega$ before the polarization and insulation resistances not higher than $10^7\Omega$ after the left-in-high-humidity test, thus not being preferable.

Samples Nos. 50-56 which were sintered by the opened sintering at Step 108 of FIG. 1 have high insulation resistances of $10^9\Omega$ before the polarization. However, in these samples, a greater amount of lead spattered than samples sintered by the closed sintering, and defect of oxygen in crystalline grating occurred. Hence, these samples have insulation resistances not higher than $10^8\Omega$, thus not being preferable.

As described, the piezoelectric ceramic composition expressed as a basic formula of $Pb(Zn_{1/3}Nb_{2/3})_aZr_xTi_yO_3$ (0.90<a+x+y<1), is sintered at a temperature ranging from 800° C. to 930° C. by the closed sintering, and is heated for the heat treatment at a temperature ranging from 450° C. to 800° C. in the partial pressure of oxygen not lower than 20 kPa for a duration not shorter than one hour, hence having a high insulation resistance before the polarization and having the insulation resistance not decrease even in a high-temperature and high-humidity condition.

Exemplary Embodiment 2

Figure 6:
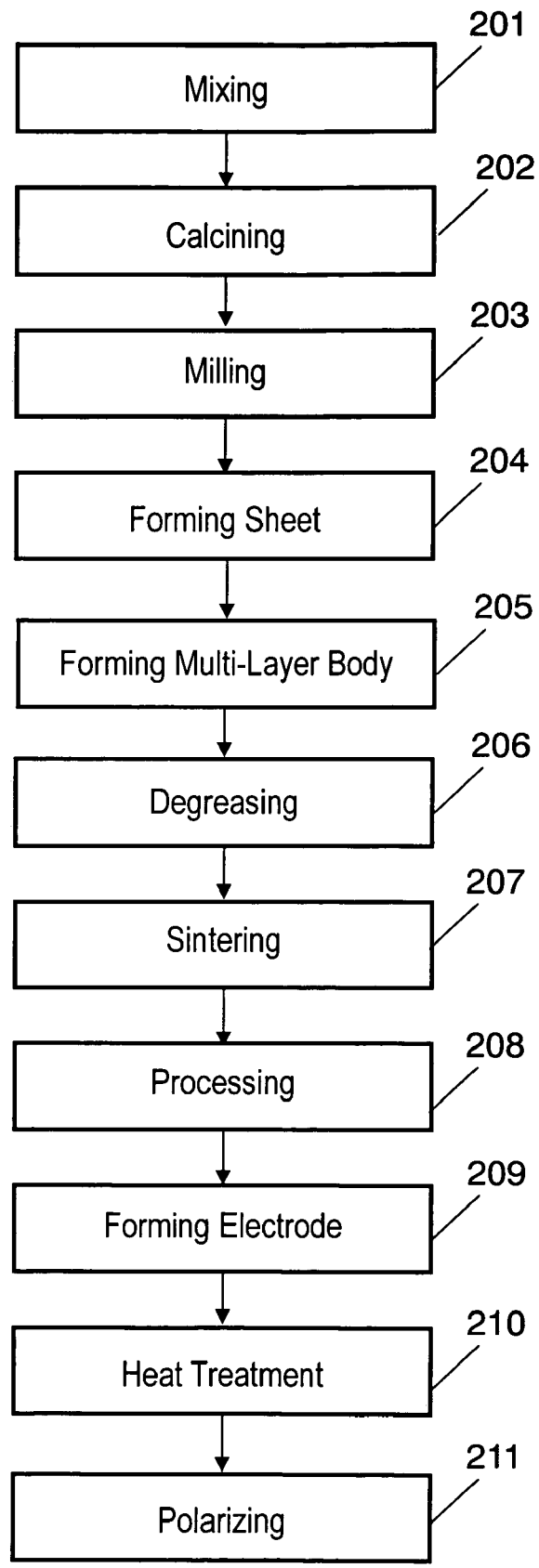
FIG. 6 illustrates processes for producing piezoelectric ceramic composition according to Embodiments 2 and 4 of the invention.
Figure 7:
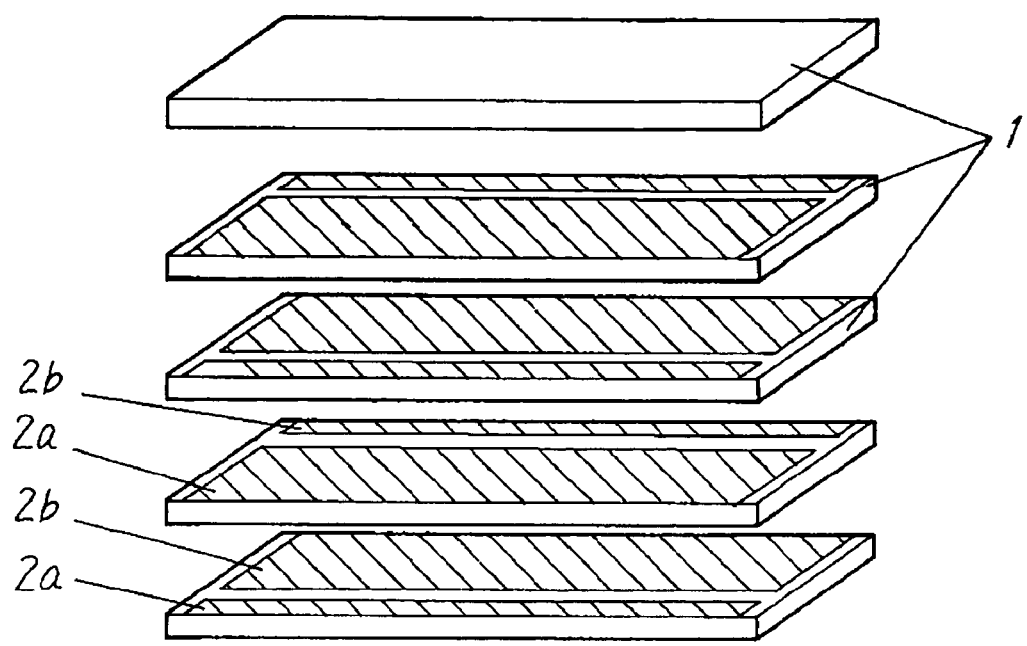
FIG. 7 is an exploded perspective view of a multi-layer piezoelectric actuator element according to the embodiment.
Figure 8:
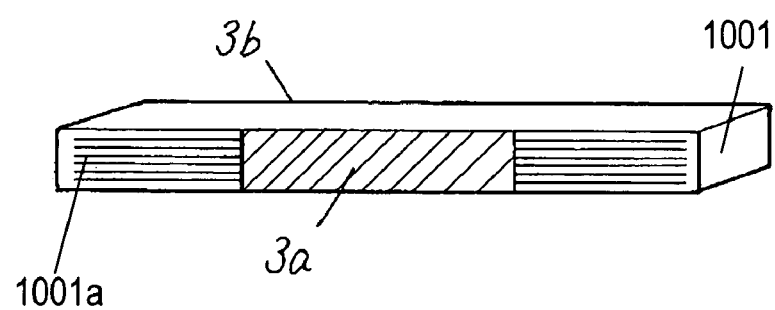
FIG. 8 is a perspective view of the multi-layer piezoelectric actuator element according to the embodiment.

FIG. 6 illustrates processes for producing piezoelectric ceramic composition used in a piezoelectric ceramic device according to Exemplary Embodiment 2 of the present invention. FIG. 7 is an exploded perspective view of a multi-layer piezoelectric actuator as the piezoelectric ceramic device according to Embodiment 2. FIG. 8 is a perspective view of the actuator.

According to Embodiment 2, the multi-layer piezoelectric actuator will be described as a device having a multi-layer structure produced by sintering piezoelectric ceramic composition and an internal electrode containing more than 95% of Ag simultaneously. The internal electrode can reduce the content of palladium (Pd), expensive element. Further, a method of producing the piezoelectric ceramic composition having a stable, high insulation resistance even under high-temperature and high-humidity condition will be explained.

Powders of lead oxide (PbO), titanium oxide ($TiO_2$), zirconium oxide ($ZrO_2$), zinc oxide (ZnO), and niobium oxide ($Nb_2O_5$) are weighed and mixed so that metallic elements of the oxides are contained at the molar ratios shown in FIG. 9 (Step 201). Then, ceramic powder is obtained similarly to Steps 102 and 103 shown in FIG. 1 (Steps 202 and 203).

The ceramic powder is then mixed with organic binder, plasticizer, and organic solvent so as to provide slurry. The slurry is shaped by a doctor blade technique to provide un-sintered, piezoelectric ceramic green sheet 1 having a predetermined thickness and serving as a piezoelectric ceramic layer in the multi-layer structure (Step 204).

Internal electrodes 2a and 2b are printed by applying conductive paste containing more than 95% of silver (Ag) onto the piezoelectric ceramic green sheet 1, as shown in FIG. 7. Another piezoelectric ceramic green sheet 1 is stacked on the piezoelectric ceramic green sheet 1 having the internal electrodes 2a and 2b thereon, and is pre-pressed. Then, internal electrodes 2a and 2b are printed again. The stacking, the pre-pressing, and the printing of the internal electrodes 2a and 2b are repeated, and finally, a piezoelectric ceramic green sheet 1 having no internal electrode thereon is stacked, thus providing a multi-layer body. The multilayer body 1 is pre-pressed and then pressed by a pressure of 18 MPa to have predetermined characteristics. The pressed multi-layer body is cut by a cutting machine into multi-layer bodies 1001 having substantially rectangular shapes of predetermined sizes (Step 205).

Then, the multi-layer body 1001 is degreased at a temperature lower than a sintering temperature to remove organic components from the body (Step 206).

The multi-layer body 1001 is sintered at a temperature not higher than 930° C. by a closed sintering or by an opened sintering to provide a multi-layer piezoelectric actuator element (Step 207).

The multi-layer piezoelectric actuator element 1001 is ground so that side surfaces 1001$a$ of the inner electrodes 2$a$ and 2$b$ in a width direction of the actuator element are exposed (Step 208).

Then, silver paste containing glass frit is applied on predetermined portions corresponding to external electrodes 3$a$ and 3$b$ provided at the portions, and is then dried. The multi-layer piezoelectric actuator element having the external electrodes 3$a$ and 3$b$ is then sintered at a temperature of about 700° C. for ten minutes to form the electrodes 3$a$ and 3$b$, as shown in FIG. 8 (Step 209).

The multi-layer piezoelectric actuator element having the external electrodes 3$a$ and 3$b$ is subjected to a heat treatment (Step 210). That is, the element is heated up at a temperature-rising speed of 200° C./hour, and is held at a maximum temperature ranging from 450° C. to 850° C. for a predetermined duration of time. Then, the element is cooled down at a temperature-falling speed of 200° C./hour to a room temperature. Then, insulation resistances of ceramic sheets 1 are measured.

Then, the piezoelectric sheets 1 are immersed in silicone oil bath at 100° C. and are polarized by applying an electric field of 3 kV/mm between the internal electrodes 2$a$ and 2$b$ for thirty minutes (Step 211), thus providing the multi-layer piezoelectric actuator shown in FIG. 8.

The multi-layer piezoelectric actuator has a length of 15 mm, a thickness of 11.0 mm, and a width of 3.0 mm. The internal electrodes extend by 14 mm. Piezoelectric ceramic layer corresponding to the ceramic sheet 1 has a thickness of about 0.09 mm. The number of the piezoelectric ceramic layers is ten, and the internal electrodes are patterned on nine layers.

Samples of multi-layer piezoelectric actuator as a piezoelectric ceramic device produced by the foregoing method were evaluated. FIGS. 9-11 illustrate insulation resistances of the samples. The insulation resistances were measured before the polarization at Step 211 and after a left-in-high-humidity test in which the samples are left in a high temperature (120° C.), a high humidity (100%), and a high atmospheric pressure (2 atm). Defective samples having insulation resistances not higher than $10^8\Omega$ are marked with "*".

Samples Nos. 57-64 which were sintered by the closed sintering and subjected to the heat treatment at a temperature ranging from 450° C. to 800° C. for a duration longer than one hour at Step 210 have insulation resistances not lower than $10^9\Omega$ before the polarization and insulation resistances not lower than $10^9\Omega$ after the left-in-high-humidity test, thus having target characteristics.

Sample No. 65 which was subjected to the heat treatment at a temperature out of the range from 450° C. to 800° C. at Step 210 has an insulation resistance lower than $10^6\Omega$ after the left-in-high-humidity test, thus not being preferable.

Samples Nos. 66-74 which were sintered by the opened sintering and subjected to the heat treatment at a temperature ranging from 450° C. to 750° C. have insulation resistances not higher than $10^8\Omega$ before the polarization and insulation resistances not higher than $10^7\Omega$ after the left-in-high-humidity test, thus not being preferable.

In order to obtain piezoelectric composition which is sintered at a sintering temperature not higher than 930° C. and has stable characteristics, an atmosphere at the sintering and the concentration of oxygen in an atmosphere at the heat treatment were studied. Powders of PbO, $TiO_2$, $ZrO_2$, ZnO, and $Nb_2O_5$ were weighed and mixed so that metallic elements of the oxides exhibit the composition shown in FIG. 10. Then, samples of the piezoelectric actuator, the piezoelectric ceramic element, were produced by the processes shown in FIG. 6. The samples of the piezoelectric ceramic element were subjected to the heat treatment at Step 210 at temperatures and partial pressures of oxygen shown in FIG. 10. At the heat treatment, maximum temperatures were held for one hour.

Samples No. 77 and 79 which were sintered by the closed sintering and subjected to the heat treatment at partial pressures of oxygen not lower than 20 kPa have insulation resistances of $10^9\Omega$ before the polarization and insulation resistances of $10^9\Omega$ after the left-in-high-humidity test in which the samples are left at a high temperature (120° C.), a high humidity (100%), and a high atmospheric pressure (2 atm), thus having target characteristics.

Sample Nos. 75, 76, 78, and 80 which were sintered by the closed sintering and subjected to the heat treatment under partial pressures of oxygen of 10 kPa or sintered by the opened sintering and subjected to the heat treatment under partial pressures of oxygen not lower than 20 kPa were subjected to the heat treatment at a temperature of 550° C. These samples have insulation resistances lower than $10^8\Omega$ before the polarization and insulation resistances lower than $10^8\Omega$ after the left-in-high-humidity test, thus not being preferable.

In order to obtain piezoelectric composition having a sintering temperature not lower than 930° C. and stable characteristics, an atmosphere at the sintering and an appropriate temperature of the sintering were studied. Powders of PbO, $TiO_2$, $ZrO_2$, ZnO, and $Nb_2O_5$ were weighed and mixed so that metallic elements of the oxides exhibit the composition shown in FIG. 11, and were sintered at temperatures and atmosphere shown in FIG. 11, and then samples of piezoelectric actuator, a piezoelectric ceramic element, were produced by the processes shown in FIG. 6. The sintering temperatures shown in FIG. 11 are maximum temperatures, and the maximum temperatures were held for two hours. Formed bodies provided were placed in a fire-resistant container having a cover to be sintered therein. Atmosphere at the sintering was studied in two methods: a closed sintering to bake samples in the container closed with the cover; and an opened sintering to bake samples in the opened container with the cover opened.

Samples No. 82-86 which were sintered at temperatures ranging from 800° C. to 920° C. by the closed sintering and were heated for one hour under partial pressures of oxygen of 20 kPa at a temperature of 600° C. to be subjected to the heat treatment at Step 210 have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmosphere (2 atm), thus having target characteristics.

Samples Nos. 81 and 87 which were sintered at a temperature lower than 800° C. and at a temperature not lower than 950° C., respectively, have insulation resistances lower than $10^9\Omega$ before the polarization and insulation resistance not higher than $10^7\Omega$ after the left-in-high-humidity test, thus not being preferable.

In samples Nos. 88-94 which were sintered by the opened sintering, a greater amount of lead spattered than samples sintered by the closed sintering, and defect of oxygen in crystalline grating occurred. These samples have insulation resistances lower than $10^9\Omega$ before the polarization and insulation resistances not higher than $10^8\Omega$ after the left-in-high-humidity test, thus not being preferable.

As described, the piezoelectric ceramic device according to Embodiment 2 having a multi-layer structure is produced, similarly to that of Embodiment 1, by sintering the internal electrode and the piezoelectric ceramic composition simultaneously at a temperature ranging from 800° C. to 930° C. by the closed sintering and by heating at a temperature ranging from 450° C. to 800° C. under a partial pressure of oxygen not lower than 20 kPa for a duration not shorter than one hour to be subjected to the heat treatment, hence having a high insulation resistance before the polarization and having the insulation resistance not decrease even in a high-temperature and high-humidity condition.

Exemplary Embodiment 3

Processes for producing a piezoelectric ceramic composition used in a piezoelectric ceramic device according to Exemplary Embodiment 3 are identical to those of Embodiment 1 shown in FIG. 1.

Powder of lead oxide (PbO), titanium oxide ($TiO_2$), zirconium oxide ($ZrO_2$), zinc oxide (ZnO), niobium oxide ($Nb_2O_5$), and manganese dioxide ($MnO_2$) were weighed and mixed so that metallic elements of them exhibit the molar ratio shown in FIG. 12. The processes according to Embodiment 3 are identical to those of Embodiment 1 except that the composition contains $MnO_2$, and are not described.

Samples of the piezoelectric ceramic device produced by the processes according to Embodiment 3 were evaluated. FIGS. 12-15 illustrate insulation resistances of the samples before the polarization at Step 110 and insulation resistances after a left-in-high-humidity test in which the samples are left at a high temperature (120° C.), a high humidity (100%), and a high atmospheric pressure (2 atm). In FIGS. 12-15, defective samples having insulation resistances not higher than 1018 are marked with "*", and samples sintered at temperatures higher than 930° C. are marked with Sintering temperatures shown in FIG. 12 are minimum temperatures providing the samples of the piezoelectric ceramic device with densities not smaller than 7500 kg/m³.

In FIGS. 12-15, piezoelectric ceramic compositions are expressed by a basic formula of $Pb(Zn_{1/3}Nb_{2/3})_aZr_xTi_yO_3$, where "a" is a molar ratio of $Zn_{1/3}Nb_{2/3}$, "x" is a molar ratio of Zr, and "y" is a molar ratio of Ti while a molar ratio of Pb is "1", and contains αwt % of $MnO_2$.

Samples Nos. 97 and 98 specified by $0.90 < a+x+y < 1.0$ and α is smaller than 2 wt % were sintered at temperatures not higher than 930° C. and have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 101-104 which were not subjected to the heat treatment at Step 109 have insulation resistances not higher than $10^8\Omega$ before the polarization, thus not having target characteristics.

In samples Nos. 95 and 96 specified by $a+x+y \leq 0.90$, defect of oxygen occurring at the sintering was not compensated for even after the heat treatment. These samples have low insulation resistances of $10^8\Omega$ before the polarization, thus not being preferable.

Samples Nos. 99 and 100 specified by $a+x+y \geq 1.0$ were sintered at temperatures out of a range from 800° C. to 930° C., which allows a device to include an inexpensive internal electrode containing not smaller than 95% of Ag.

In order to obtain piezoelectric composition having a sintering temperature not higher than 930° C. and stable characteristics, an appropriate temperature at the heat treatment was studied. Powders of PbO, $TiO_2$, $ZrO_2$, ZnO, $Nb_2O_5$, and $MnO_2$ were weighed and mixed so that metallic elements of the oxides exhibit the composition shown in FIG. 13. Then, samples of the piezoelectric ceramic element were produced by the procedure shown in FIG. 1. The samples were heated at temperatures for durations of time shown in FIG. 13 to be subjected to the heat treatment at Step 109. The temperatures for the heat treatment shown in FIG. 13 are maximum temperatures while the durations of time are durations for which the maximum temperatures were held. A temperature-rising speed and a temperature-falling speed from the maximum temperatures were 200° C./hour. The samples were then evaluated in insulation resistances before the polarization and after the left-in-high-humidity test in which the samples are left at a high temperature (120° C.), a high humidity (100%), and a high atmospheric pressure (2 atm).

Samples Nos. 107-109 and 111-117 which were subjected to the heat treatment at temperatures ranging from 450° C. to 800° C. for durations not shorter than one hour have insulation resistances not lower than $10^9\Omega$ before the polarization and insulation resistances not lower than $10^9\Omega$ after the left-in-high-humidity test, thus having target characteristics.

In samples Nos. 105 and 106, deficiency of oxygen occurring at the baking was not compensated for due to low temperatures at the heat treatment, and the samples stay in semiconductor state. These samples have insulation resistances of $10^8\Omega$ before the polarization and insulation resistances not higher than $10^7\Omega$ after the left-in-high-humidity test, thus not being preferable.

In sample No. 110 subjected to the heat treatment for a short duration of 0.2 hour, defect of oxygen occurring at the sintering is not compensated for in semiconductor state. This sample has a high insulation resistance of $10^9\Omega$ before the polarization and an insulation resistance not higher than $10^7\Omega$ after the left-in-high-humidity test, thus not being preferable.

Samples Nos. 118 and 119 heated at temperatures not lower than 850° C. at the heat treatment have high insulation resistances of $10^9\Omega$ before the polarization and insulation resistances not higher than $10^7\Omega$ after the left-in-high-humidity test, thus not being preferable. Since the temperature not lower than 850° C. at the heat treatment is close to the sintering temperature, the heat treatment at Step 109 causes irregular granular growth and re-sintering of the heat treatment, thus causing this result.

In order to obtain piezoelectric composition having a sintering temperature not higher than 930° C. and stable characteristics, a partial pressure of oxygen in atmosphere at the heat treatment and a maximum temperature at the heat treatment were studied. Powders of PbO, $TiO_2$, $ZrO_2$, ZnO, $Nb_2O_5$, and $MnO_2$ were weighed and mixed so that metallic elements of the oxides exhibit the composition shown in FIG. 14, and then samples of the piezoelectric ceramic element were produced by the processes shown in FIG. 1. The samples were heated at temperatures and partial pressures of oxygen shown in FIG. 14 to be subjected to the heat treatment. In the heat treatment, maximum temperatures were held for one hour.

Samples Nos. 125-134 heated in partial pressures of oxygen not lower than 20 kPa to be subjected to the heat treatment at Step 109 have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 120-124 heated in partial pressures of oxygen of 10 kPa at temperatures ranging from 450° C. to 750° C. to be subjected to the heat treatment have insulation resistances of $10^7\Omega$ before the polarization and insulation resistances lower than $10^6\Omega$ after the left-in-high-humidity test, thus not being preferable.

In order to obtain piezoelectric composition having a sintering temperature not higher than 930° C. and stable characteristics, a sintering temperature and an atmosphere at the sintering were studied. Powders of PbO, $TiO_2$, $ZrO_2$, ZnO, $Nb_2O_5$, and $MnO_2$ were weighed and mixed so that metallic elements of the oxides exhibit the composition shown in FIG. 15, and sintered at temperatures and atmosphere shown in FIG. 15. Then, samples of the piezoelectric ceramic element were produced by the processes shown in FIG. 1. Sintering temperatures shown in FIG. 15 are maximum temperatures and held for two hours. The samples were placed in a heat-resistant container having a cover to be sintered. Atmosphere during the sintering was studied in two methods: a closed sintering to sinter the samples in the container closed with the cover; and an opened sintering to sinter the sample in the container with the cover in an opened state.

Samples Nos. 136-140 sintered by the closed sintering and subjected to the heat treatment at Step 109 at 600° C. for one hour have insulation resistances not lower than $10^9\Omega$ before the polarization and insulation resistances not lower than $10^9\Omega$ after the left-in-high-humidity test in which the samples are left at a high temperature (120° C.), a high humidity (100%), and a high atmospheric pressure (2 atm), thus having target characteristics.

Samples Nos. 135 and 141 sintered at a temperature lower than 800° C. and a temperature higher than 950° C., respectively, have insulation resistances lower than $10^9\Omega$ before the polarization and insulation resistances not higher than $10^7\Omega$ after the left-in-high-humidity test, thus not being preferable.

In samples Nos. 142-148 sintered by the opened sintering, a greater amount of lead spattered than samples sintered by the closed sintering, and defect of oxygen in crystalline grating was not compensated for. These samples have high insulation resistances of $10^9\Omega$ before the polarization and insulation resistances not higher than $10^8\Omega$ after the left-in high-humidity test in which the samples are left at a high temperature (120° C.), a high humidity (100%), and a high atmospheric pressure (2 atm), thus not being preferable.

As described, the piezoelectric ceramic composition according to Embodiment 3, similarly to that of Embodiment 1, is sintered at a temperature ranging from 800° C. to 930° C. by the closed sintering and is heated at a temperature ranging from 450° C. to 800° C. in partial pressure of oxygen not lower than 20 kPa for a duration not shorter than one hour to be subjected to the heat treatment, hence having a high insulation resistance before the polarization and having the insulation resistance not decrease even in a high-temperature and high-humidity condition.

Exemplary Embodiment 4

Processes for producing a piezoelectric ceramic composition used in a piezoelectric ceramic device according to Exemplary Embodiment 4 of the present invention are identical to those of Embodiment 2 shown in FIG. 6. FIG. 12 is an exploded perspective view of a multi-layer piezoelectric transformer as the piezoelectric ceramic device according to Embodiment 4. FIG. 13 is a perspective view of the piezoelectric transformer.

According to Embodiment 4, the multi-layer piezoelectric transformer will be explained as the piezoelectric ceramic device having a multi-layer structure produced by sintering the piezoelectric ceramic composition and an inexpensive internal electrode containing more than 95% Ag to reduce the content of expensive palladium (Pd). A method of producing the piezoelectric ceramic composition having a stable insulation resistance used even in a high-temperature and high-humidity condition will be explained.

According to Embodiment 4, the piezoelectric ceramic component identical to that of Embodiment 2 contains $MnO_2$ while being produced by the same processes shown in FIG. 6.

First, powders of lead oxide (PbO), titanium oxide ($TiO_2$), zirconium oxide ($ZrO_2$), zinc oxide (ZnO), niobium oxide ($Nb_2O_5$), and manganese dioxide ($MnO_2$) are weighed and mixed so that a molar ratio of each metallic element of the oxides exhibits the composition shown in FIG. 18 (Step 201). The mixed powder is then modified into piezoelectric ceramic powder (Steps 202 and 203).

The piezoelectric ceramic powder is then mixed with organic binder, plasticizer, and organic solvent to provide slurry. The slurry is shaped in a sheet by a doctor blade technique to provide a piezoelectric ceramic sheet 4 having a predetermined thickness and serving as a piezoelectric ceramic layer in the multi-layer structure (Step 204).

Figure 16:
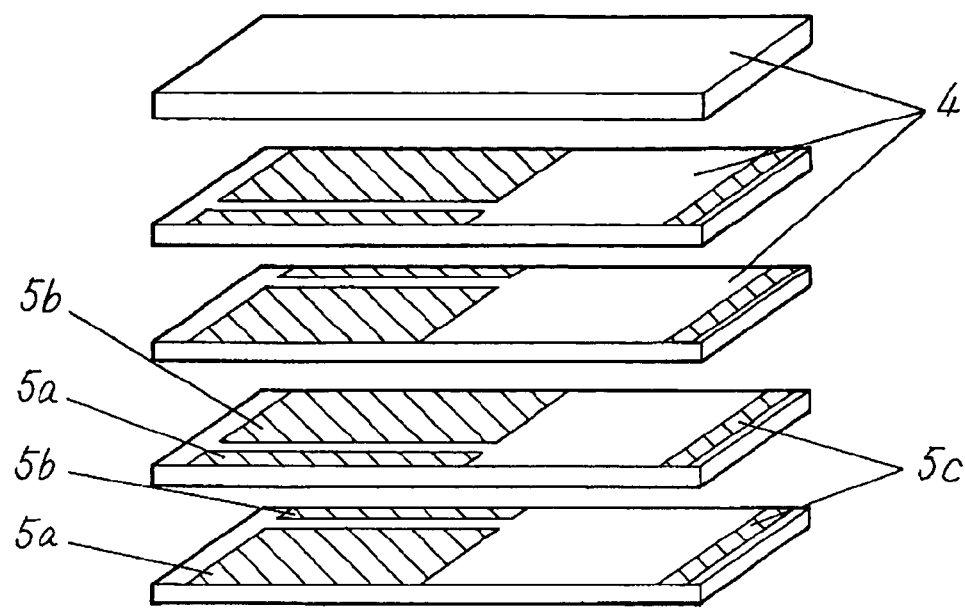
FIG. 16 is an exploded perspective view of a multi-layer piezoelectric transformer element according to the embodiment.

Then, conductive paste containing more than 95% of silver is applied onto piezoelectric ceramic sheet 4 to print internal electrodes 5a, 5b, and 5c, as shown in FIG. 16. Another piezoelectric ceramic sheet having no conductive paste applied thereon is stacked on the piezoelectric ceramic sheet 4 having the internal electrodes 5a, 5b, and 5c thereon, and is pre-pressed. Then, the conductive paste is applied to provide internal electrodes 5a, 5b, and 5c. The stacking of plural piezoelectric ceramic sheets, the pre-pressing, and the printing of the internal electrodes 5a, 5b, and 5c are repeated. Finally, piezoelectric ceramic sheet 4 having no conductive paste applied thereon is stacked to provide a multi-layer body to provide predetermined characteristics. The multilayer body is pre-pressed and then pressed at a pressure of 18 MPa. The pressed multi-layer body is cut by a cutting machine into elements, thus providing a multi-layer body 1002 having a rectangular shape of a predetermined size (Step 205).

Then, the multi-layer body 1002 is degreased at a temperature lower than a sintering temperature to remove organic component from the body (Step 206).

Then, the multi-layer body 1002 is sintered at a temperature not higher than 930° C. by a closed or opened sintering to provide a multi-layer piezoelectric transformer element (Step 207).

The multi-layer piezoelectric transformer element is processed, i.e., ground by barrel polishing to expose side surfaces 1002a of the inner electrodes 5a, 5b, and 5c (Step 208).

Then, silver paste containing glass frit is applied onto predetermined portions corresponding to external electrodes 6a, 6b, and 6c, and is dried. The multi-layer piezoelectric transformer element shown in FIG. 17 and having the external electrodes 6a, 6b, and 6c thereon are then sintered at a temperature of about 700° C. for ten minutes (Step 209).

Then, the multi-layer piezoelectric transformer element having the external electrodes 6a, 6b, and 6c thereon is subjected to a heat treatment in which the element is heated up at a temperature-rising speed of 200° C./hour, and held at a maximum temperature ranging from 450° C. to 850° C. for a predetermined duration of time, and is cooled down at a temperature-falling speed of 200° C./hour to a room temperature (Step 210). Then, an insulation resistance of ceramic sheet 4 is measured.

Figure 17:
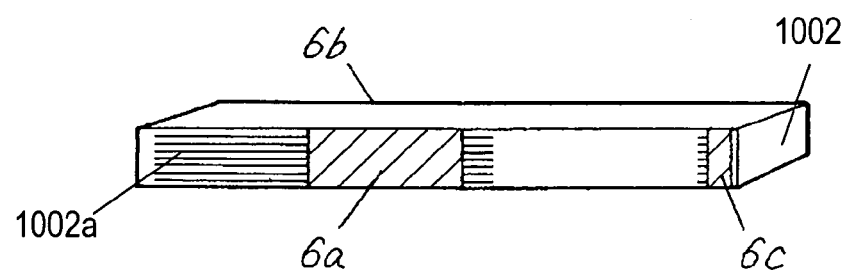
FIG. 17 is a perspective view of the multi-layer piezoelectric transformer element according to the embodiment.

Then, the piezoelectric sheets 4 are immersed in silicone oil bath at 100° C. and polarized by applying an electric field of 3 kV/mm between the internal electrodes 2a and 2b for thirty minutes, and by applying an electric field of 2 kV/mm between the external electrodes 6a and 6c for thirty minutes (Step 211), thus providing a multi-layer piezoelectric transformer shown in FIG. 17.

The multi-layer piezoelectric transformer had a length of 30 mm, a thickness of 2.4 mm, and a width of 5.8 mm. The internal electrodes extended in 18 mm. Each piezoelectric ceramic layer corresponding to the ceramic sheets 4 had a thickness of about 0.15 mm. The number of the piezoelectric ceramic layers was fifteen, and the internal electrodes were provided on sixteen layers.

FIGS. 18-20 illustrate insulation resistances of samples of the piezoelectric ceramic transformer produced under conditions shown in the figures. The insulation resistances were measured before the polarization at Step 211 and after a left-in-high-humidity test in which the samples are left at a high temperature (120° C.), a high humidity (100%), and a high atmospheric pressure (2 atm). Defective samples having insulation resistances not higher than $10^8\Omega$ are marked with "*".

Samples Nos. 149-156 sintered by the closed sintering and heated at a temperature ranging from 450° C. to 800° C. for a duration not shorter than one hour to be subjected to the heat treatment have insulation resistances not lower than $10^9\Omega$ before the polarization and insulation resistances not lower than $10^9\Omega$ after the high-humidity test in which the samples are left at a high temperature (120° C.), a high humidity (100%), and a high atmospheric pressure (2 atm), thus having target characteristics.

Sample No. 157 subjected to the heat treatment at a temperature out of the range from 450° C. to 800° C. has an insulation resistance lower than $10^6\Omega$ after the left-in-high-humidity test, thus not being preferable.

Samples Nos. 158-166 sintered by the opened sintering and subjected to the heat treatment at a temperature ranging from 450° C. to 750° C. have insulation resistances $10^8\Omega$ before the polarization and insulation resistances lower than $10^7\Omega$ after the left-in-high-humidity test, thus not being preferable.

In order to obtain piezoelectric ceramic composition having a sintering temperature not higher than 930° C. and stable characteristics, an atmosphere at the sintering and a partial pressure of oxygen in an atmosphere at the heat treatment were studied. Powders of PbO, $TiO_2$, $ZrO_2$, ZnO, $Nb_2O_5$, and $MnO_2$ were weighed and mixed so that metallic elements of the oxides exhibit the composition shown in FIG. 19, and then, samples of the piezoelectric ceramic device were produced by the processes shown in FIG. 6. The samples of the piezoelectric ceramic device were subjected to the heat treatment at temperatures and partial pressures of oxygen shown in FIG. 19. In the heat treatment the temperatures were held for one hour.

Samples Nos. 169 and 171 sintered by the closed sintering and subjected to the heat treatment at a partial pressure of oxygen not lower than 20 kPa have insulation resistances of $10^9\Omega$ before the polarization and insulation resistances of $10^9\Omega$ after the left-in-high-humidity test in which the samples are left at a high temperature (120° C.), a high humidity (100%), and a high atmospheric pressure (2 atm), thus having target characteristics.

Samples No. 167, 168, 170, and 172 sintered by the opened sintering and heated at 550° C. under partial pressures of oxygen of 10 kPa for one hour for the heat treatment or heated at 550° C. under partial pressures of oxygen of 20 kPa for one hour for the heat treatment have high insulation resistances of $10^9\Omega$ before the polarization and insulation resistances lower than $10^8\Omega$ after the left-in-high-humidity test, thus not being preferable.

In order to obtain piezoelectric ceramic composition having a sintering temperature not higher than 930° C. and stable characteristics, an atmosphere at the sintering and an appropriate sintering temperature were studied. Powders of PbO, $TiO_2$, $ZrO_2$, ZnO, $Nb_2O_5$, and $MnO_2$ were weighed and mixed so that metallic elements of the oxides exhibit the composition shown in FIG. 20, and then, samples of the piezoelectric ceramic device were produced by the processes shown in FIG. 6. Sintering temperatures shown in FIG. 20 are maximum temperatures at Step 207. The maximum temperatures were held for two hours. The samples were placed in a heat-resistant container having a cover and sintered therein. The atmosphere at the sintering was studied in two methods: a closed sintering to bake samples in the container with the cover closed; and an opened sintering to bake samples in the container with the cover opened.

Samples Nos. 174-178 sintered by the closed sintering at a sintering temperature ranging from 800° C. to 920° C. and heated at 600° C. under partial pressures of oxygen of 20 kPa for one hour to be subjected to the heat treatment at Step 210 have insulation resistances not lower than $10^9\Omega$ before the polarization and insulation resistances not lower than $109\Omega$ after the left-in-high-humidity test in which the samples are left at a high temperature (120° C.), a high humidity (100%), and a high atmospheric pressure (2 atm), thus having target characteristics.

Samples Nos. 173 and 179 sintered at a temperature lower than 800° C. and a temperature not lower than 950° C., respectively, have insulation resistances lower than $10^9\Omega$ before the polarization and insulation resistances not higher than $10^7\Omega$ after the left-in-high-humidity test, thus not being preferable.

In samples sintered by the opened sintering, a greater amount of lead spatters than samples sintered by the closed sintering, and more defect of oxygen in crystalline grating occurs than the samples sintered by the closed sintering. Samples Nos. 180-186 have insulation resistances lower than $10^9\Omega$ before the polarization and insulation resistances not higher than $10^8\Omega$ after the left-in-high-humidity test, thus not being preferable.

The piezoelectric ceramic device according to Embodiment 4 having a multi-layer structure is produced by sintering piezoelectric ceramic composition and the internal electrodes simultaneously, similarly to that of Embodiment 3, at a temperature ranging from 800° C. to 930° C. by the closed sintering and by heating it at a temperature ranging from 450° C. to 800° C. under the partial pressure of oxygen not lower than 20 kPa for a duration not shorter than one hour to have it subjected to the heat treatment. The piezoelectric composition has stable characteristics and a high insulation resistance before the polarization, and has the insulation resistance not decrease even in a high-temperature and high-humidity condition.

According to Embodiments 3 and 4, $MnO_2$ is added to the composition to have the composition contain metallic element of Mn. Compound containing Mn, such as $Mn_3O_4$ or $MnCO_3$ other than $MnO_2$, may be added to the composition. Such Mn compound is oxidized at the calcining and sintering at Steps 102, 106, 107, 202, and 207 to be included as oxide of Mn, hence providing the same effects. If the amount of the Mn compound converted into $MnO_2$ is the same, that is, if the Mn compound contains the same amount of Mn as $\alpha$wt % of $MnO_2$, the same effect as $MnO_2$ is provided.

According to Embodiments 2 and 4, the external electrodes 3a, 3b, and 6a-6c are provided by printing before the drying and the sintering (Step 108 in FIG. 1 and Step 209 in FIG. 6). The heat treatment at Steps 109 and 210 may be executed after the external electrodes 3a, 3b, and 6a-6c are printed. That is, the sintering of the external electrodes may be executed simultaneously to the heat treatment at Steps 109 and 210, hence providing the same effects of the heat treatment.

The multi-layer piezoelectric actuator made of soft material not containing Mn and the multi-layer piezoelectric transformer made of hard material containing Mn are explained as the piezoelectric ceramic device having a multi-layer structure. Piezoelectric ceramic device having a multi-layer structure, such as a harmonic resonator, a harmonic filter, or an acceleration sensor, may be produced by the method according to Embodiments 1-4, thus providing the same effects.

What is claimed is:

1. A method of producing a piezoelectric ceramic device, said method comprising:
    providing starting materials for a piezoelectric ceramic composition expressed by a basic formula of $Pb(Zn_{1/3}Nb_{2/3})_aZr_xTi_yO_3$ (where $0.90<a+x+y<1.00$);
    calcining a mixture of the starting materials;
    milling the calcined material to provide powder;
    providing a formed body containing the powder;
    degreasing the formed body at a temperature at which the formed body is not sintered;
    providing a sintered body by sintering the degreased body;
    heating the sintered body to subject the sintered body to predetermined heat treatment; and
    polarizing the sintered body subjected to the predetermined heat treatment to provide a sintered body with a piezoelectric property.

2. The method according to claim 1, wherein said heating the sintered body comprises maintaining the sintered body at a temperature ranging from 450° C. to 800° C. for a duration not shorter than one hour.

3. The method according to claim 2, wherein said heating the sintered body comprises heating the sintered body in an atmosphere of a partial pressure of oxygen not lower than 20 kPa.

4. The method according to claim 3, wherein said providing the sintered body by sintering the degreased body comprises sintering the degreased body in a closed atmosphere.

5. The method according to claim 4, wherein said providing the sintered body by sintering the degreased body comprises
    placing the degreased body in a closed container, and
    sintering the degreased body in the closed container.

6. The method according to claim 3, wherein said providing the sintered body by sintering the degreased body comprises sintering the degreased body while preventing Pb from spattering.

7. The method according to claim 1, wherein said providing the sintered body by sintering the degreased body comprises sintering the degreased body at a temperature ranging from 800° C. to 930° C.

8. The method according to claim 1, further comprising processing the sintered body.

9. The method according to claim 1, further comprising providing an electrode on the sintered body.

10. The method according to claim 1, wherein said providing the formed body comprises:
    providing a slurry containing the powder,
    providing a ceramic green sheet by shaping the slurry, and
    applying paste mainly containing Ag on the ceramic green sheet to provide a multi-layer body as the formed body.

11. The method according to claim 1,
    wherein the piezoelectric ceramic composition contains less than 2 wt % of $MnO_2$, and
    wherein the starting materials for the piezoelectric ceramic composition include an Mn compound in the same amount of Mn as said less than 2 wt % of $MnO_2$.

* * * * *